United States Patent [19]

Veigel

[11] 4,051,297

[45] Sept. 27, 1977

[54] TRANSPARENT ARTICLE AND METHOD OF MAKING THE SAME

[75] Inventor: Neil D. Veigel, Novi, Mich.

[73] Assignee: Shatterproof Glass Corporation, Detroit, Mich.

[21] Appl. No.: 714,783

[22] Filed: Aug. 16, 1976

[51] Int. Cl.² .................... C23C 15/00; B32B 17/06
[52] U.S. Cl. .................. 428/336; 204/192 P; 427/163; 427/167; 427/255; 428/428; 428/432; 428/446; 428/539
[58] Field of Search .................. 252/518, 518.1; 428/428, 432, 446, 539, 336; 427/167, 163, 255; 204/192 P, 192 C

[56] References Cited

U.S. PATENT DOCUMENTS

| | | | |
|---|---|---|---|
| 2,851,376 | 9/1958 | Adlassnig | 428/432 |
| 2,982,619 | 5/1961 | Long | 106/55 |
| 3,009,886 | 11/1961 | Wejnarth | 252/518 |
| 3,027,332 | 3/1962 | Medin | 252/520 |

*Primary Examiner*—Ellis Robinson
*Attorney, Agent, or Firm*—William E. Nobbe

[57] ABSTRACT

A transparent article having improved abrasion resistance, and method of making the same, which comprises a body of transparent glassy siliceous material having a smooth continuous surface and a continuous film of chromium silicide sputter-coated on said continuous surface to a thickness of from about 200 to 1,000 A.

5 Claims, 1 Drawing Figure

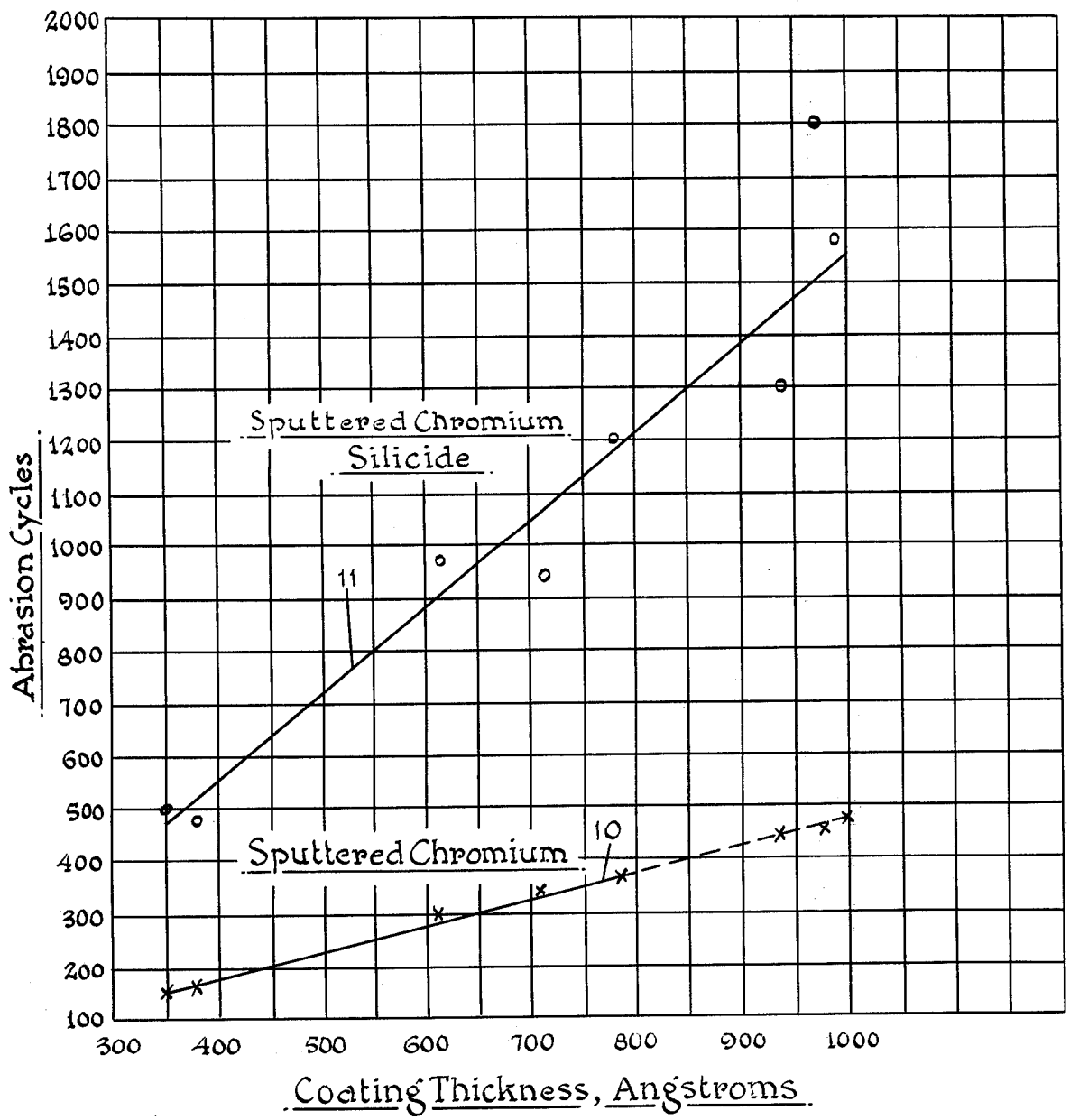

TRANSPARENT ARTICLE AND METHOD OF MAKING THE SAME

BACKGROUND OF THE INVENTION

The present invention relates to transparent articles having improved abrasion resistance and to a method for producing such articles.

The architectural trend toward using more glass in commercial buildings has been enhanced by the avilability of special coated and tinted glasses which not only serve an aesthetic purpose but also are functional. The most significant advantages of the special glasses are in the area of air conditioning. Since it generally costs from three to six times more to cool a building one degree than to heat it by the same amount (depending on the amount of glass used), the use of an exterior glass which will reduce the amount of solar radiation entering a building can provide substantial savings since less air conditioning equipment is required and its operation is less costly. The special glasses are also used in other areas where low heat transmittance is required, i.e., automobile windows and oven windows.

Over the past decade the market for colored and reflective glass has grown significantly. The colored glass involved is basically of two types — tinted and coated. Tinted glass is generally made by adding selective metals such as iron, cobalt, and nickel to the molten glass during production. This method of producing colored glass is time consuming a wasteful in that when a different color of glass is desired, a four or five-day run of glass must be discarded while the change is made and the new batch stabilized. Also, large quantities of different colors and types of glass must be inventoried. In addition, although tinted glass does reduce glare, it also absorbs heat (including solar radiation) and the absorbed heat is re-radiated from both sides of the glass. Therefore, a greater amount of heat is allowed to pass through the glass than with coated glass.

Coated or reflective glass is provided with a thin film of a reflective substance on one of its surfaces. The thin film reflects the solar radiation much more effectively than tinted glass since the glass does not adsorb the radiation. Among the materials presently employed for this purpose is chromium which can be deposited on glass sheets either by thermal deposition or by the sputter-coating technique. However, it has been found that pure chromium coatings, while used with considerable success, are not wholly satisfactory in all cases in that they are suceptible to being marred or damaged when exposed over a period of time to varying atmospheric conditions, or when subjected to repeated cleaning or rough handling. Efforts have been made to overcome this condition by overlaying the chromium film with a protective coating of a siliceous material, such as Pyrex glass, but this has not proven entirely successful.

It is therefore the primary objective of this invention to improve the abrasion resistance of sputtered coatings on glass sheets.

More particularly, it is the purpose of this invention to provide a transparent coating for glass sheets or plates, deposited thereon by sputter-coating, and which possesses greater resistance to surface abrasion than relatively pure chromium coatings.

DESCRIPTION OF THE PREFERRED EMBODIMENT

A typical article according to the present invention comprises a body of transparent glassy siliceous material having a smooth continuous surface and a continuous reflective film of chromium silicide sputter-coated on the smooth surface to a thickness of from about 200 to 1,000 A. The transparent bodies of primary concern are architectural glass, although other uses are possible, such as vehicle windows and oven windows. The glassy siliceous material is preferably conventional silicate glass, including window glass, plate glass and float glass, although any of the conventional or special purpose glasses may be employed as long as they are transparent.

In preparing glass products according to this invention, the body of transparent glassy siliceous material is first cleaned by a conventional washing operation and then placed in a deposition chamber containing an inert gas. The gas in the chamber is preferably maintained at a pressure of from 5 to 50 microns. At pressures below 5 microns the rate of deposition during coating is insufficient for most purposes and there is increased danger of surface contamination. At pressures above 50 microns the efficiency of the process is significantly reduced. The glass body is preferably heated to a temperature of about 250° C prior to processing.

The smooth continuous surface is usually ion bombarded within the chamber to finally clean and prepare the surface for receiving the coating. This is generally done by the off-sputtering or reverse sputtering technique which is commonly known. Typically, the sputter-coating time is about twenty minutes at a power density of 0.1 to 1.0-watt/cm$^2$. With certain types of substrates and certain washing or cleaning processes (prior to insertion in the chamber), the sputter-cleaning step may be unnecessary.

The clean, smooth surface is then sputter-coated with a continuous film of chromium silicide until a uniform coating of the desired thickness is obtained. Typical sputtering conditions are 5,000 volts potential on the target (coating material) and a resulting current density of 0.5 to 1.0 ma/cm$^2$ for a time period of 0.2 to several minutes depending on the thickness of coating desired.

The target usually consists of a relatively thin rectangular metal plate having a layer of the coating material to be sputtered applied to one surface thereof. The metal plate ordinarily constitutes the bottom wall of a hollow cathode which is formed with a chamber through which a cooling medium, such as water, is circulated. The cathode is positioned in the deposition chamber closely adjacent the top thereof, with the glass sheet to be coated supported horizontally therebeneath to receive the chromium silicide upon the upper surface thereof.

As is well known, chromium forms several silicides, including $Cr_3 Si$, $Cr_2 Si$, $Cr Si$ and $Cr Si_2$. Also that silicon forms a solid solution of silicon in chromium and can dissolve up to seven and one-half per cent of the silicon. The composition of the silicides are as follows:

| Silicide | wt/o Silicon |
|---|---|
| $Cr_3$ Si | 15 |
| $Cr_2$ Si | 21 |
| Cr Si | 35 |

| Silicide | wt/o Silicon |
|---|---|
| Cr Si$_2$ | 52 |

The silicided-chromium material used for forming the sputtered films of this invention is preferably in the lower part of the range of composition i.e. about six to fifteen wt/o silicon. This is preferred in order to retain properties, such as reflectance and absorbance substantially similar to that of pure chromium, while still providing a hard abrasion resistant coating. The corrosion resistance in a normal atmosphere is similar for both the chromium silicide and the relatively pure chromium currently being used.

For the preparation of sputtered silicide chromium films on glass according to the present invention, a sputtering target was prepared by reacting silicon with electrolytic chromium. This was accomplished as outlined below:

I. A 12 × 12 × ⅛ inch sheet of mild steel was electroplated with chromium on one surface as usual to form a chromium sputtering target.
II. Silicon powder (−325 mesh) was sprinkled on the electroplated surface to a depth of about ⅛ inch.
III. The target with the silicon powder was heated in a pure argon atmosphere at 1400° F. for 12 hours. This caused some of the silicon to dissolve in the chromium to form some chromium silicide.
IV. The excess residual unreacted silicon powder was brushed from the silicide chromium target.

The above method will result in a target consisting of a solid solution of silicon in chromium along with some chromium silicide (Cr$_3$Si).

The target was then used for the deposition of silicided chromium films onto 10 × 10 × ⅛ inch sheets of float (soda-lime-silica) glass by the sputtering process above described. As shown by the data given in the following Table I, the silicided chromium films have abrasion resistance significantly superior to those of unsilicided chromium. The abrasion resistance of the sputtered films was measured with a Tabor Abraser with 1000-g weights and a CS-10F wheel.

TABLE I

SUMMARY OF ABRASION RESULTS FOR SPUTTERED CHROMIUM AND SILICIDED CHROMIUM FILMS OF EQUAL THICKNESS

| COATING THICKNESS, Å | % LIGHT TRANS-MISSION | ABRASION REQUIRED TO REMOVE SILICIDED COATING | ABRASION CYCLES TO REMOVE PURE CHROMIUM COATING |
|---|---|---|---|
| 350 | 27 | 500 | 150 |
| 380 | 24 | 490 | 160 |
| 615 | 11 | 975 | 300 |
| 710 | 8 | 940 | 340 |
| 790 | 6 | 1200 | 380 |
| 940 | 2 | 1300 | 450 |
| 970 | 1.5 | 1800 | 465 |
| 1000 | 1 | 1590 | 480 |

The data given in Table 1 above is correlated with the graph shown in the accompanying drawing wherein line 10 represents the commercial sputtered coatings of substantially pure chromium and line 11 the sputtered chromium silicide coatings of this invention. As will be seen, the chromium silicide coatings possessed substantially greater resistance to abrasion than the sputtered unsilicided chromium coatings of equal thickness. Also the superiority of the chromium silicide coatings over the unsilicided chromium coatings increased with coating thickness is shown in the Figure. For example, it required 975 abrasion cycles to remove a silicided chromium coating of a thickness of 615 A as against 300 cycles for an unsilicided chromium coating of the same thickness. On the other hand, it required 1300 cycles to remove a chromium silicide coating of a thickness of 940 A as against only 450 cycles for an unsilicided chromium coating of equal thickness.

I claim:

1. An article of manufacture, a transparent glazing element comprising, a transparent sheet of glass having a smooth continuous surface, and a continuous abrasion resistant transparent reflective film of chromium silicide adhered to said smooth continuous surface, said chromium silicide film consisting essentially of chromium and silicon and being of a thickness of from about 200 to 1,000 Angstroms.

2. The method of making a transparent glazing element comprising, providing a transparent sheet of glass having a smooth continuous surface, and sputter-coating on said smooth continuous surface a continuous abrasion resistant transparent reflective film of chromium silicide consisting essentially of chromium and silicon and being of a thickness of from about 200 to 1,000 Angstroms.

3. The method of claim 2, wherein the chromium silicide is sputter-coated on the smooth continuous surface of the glass sheet in a low pressure atmosphere containing an inert gas.

4. The method of claim 2, wherein the sputter-coating involves ion bombarding a target of chromium silicide in a low-pressure gaseous atmosphere to cause atomic particles of the chromium silicide to be dislodged and deposited on the smooth continuous surface of the glass sheet.

5. In the method of making a transparent glazing element comprising a transparent sheet of glass having a smooth continuous surface and a continuous abrasion resistant reflective film adhered to said smooth continuous surface, the improvement which comprises providing a sputtering target of chromium silicide consisting essentially of chromium and silicon, and sputtering said chromium silicide from said target in a low-pressure atmosphere containing an inert gas onto said smooth continuous surface of the glass sheet to form a transparent film having a thickness of from about 200 to 1,000 Angstroms.

* * * * *

UNITED STATES PATENT AND TRADEMARK OFFICE
CERTIFICATE OF CORRECTION

PATENT NO. : 4,051,297
DATED : September 27, 1977
INVENTOR(S) : Neil D. Veigel

It is certified that error appears in the above-identified patent and that said Letters Patent are hereby corrected as shown below:

In "TABLE I", (column 3) the heading for column 3 should read:

-- Abrasion Cycles
Required to Remove
Silicided Coating --

In "TABLE I", (column 3) the heading for column 4 should read:

-- Abrasion Cycles
Required to Remove
Pure Chromium
Coating --

Signed and Sealed this

Seventeenth Day of January 1978

[SEAL]

Attest:

RUTH C. MASON
Attesting Officer

LUTRELLE F. PARKER
Acting Commissioner of Patents and Trademarks